(12) United States Patent
Diehl et al.

(10) Patent No.: US 7,924,845 B2
(45) Date of Patent: Apr. 12, 2011

(54) MESSAGE-BASED LOW LATENCY CIRCUIT EMULATION SIGNAL TRANSFER

(75) Inventors: Philippe Diehl, Versailles (FR); Marc Vieillot, Montigny le Bretonneux (FR); Cyril Quennesson, Antony (FR); Gilles Laurent, Boulogne (FR); Frederic Reblewski, Paris (FR)

(73) Assignee: Mentor Graphics Corporation, Wilsonville, OR (US)

( * ) Notice: Subject to any disclaimer, the term of this patent is extended or adjusted under 35 U.S.C. 154(b) by 1068 days.

(21) Appl. No.: 10/673,665

(22) Filed: Sep. 30, 2003

(65) Prior Publication Data

US 2005/0068949 A1 Mar. 31, 2005

(51) Int. Cl.
| | |
|---|---|
| H04L 12/28 | (2006.01) |
| H04L 12/56 | (2006.01) |
| H01L 25/00 | (2006.01) |
| G06F 9/455 | (2006.01) |
| G06F 3/00 | (2006.01) |
| G06F 11/22 | (2006.01) |
| G06F 17/50 | (2006.01) |

(52) U.S. Cl. ............. 370/395.4; 326/47; 703/28; 710/6; 716/136

(58) Field of Classification Search ................ 370/395.4, 370/395.41, 395.42, 395.43
See application file for complete search history.

(56) References Cited

U.S. PATENT DOCUMENTS

| | | | |
|---|---|---|---|
| 5,036,473 A | 7/1991 | Butts et al. | |
| 5,109,353 A | 4/1992 | Sample et al. | |
| 5,406,554 A * | 4/1995 | Parry | 370/381 |
| 5,541,918 A * | 7/1996 | Ganmukhi et al. | 370/395.7 |
| 5,563,829 A * | 10/1996 | Huang | 365/189.04 |
| 5,604,739 A * | 2/1997 | Buhrgard et al. | 370/468 |
| 5,625,625 A * | 4/1997 | Oskouy et al. | 370/395.4 |
| 5,777,489 A | 7/1998 | Barbier et al. | |
| 5,821,773 A | 10/1998 | Norman et al. | |
| 5,896,380 A * | 4/1999 | Brown et al. | 370/388 |
| 5,923,656 A * | 7/1999 | Duan et al. | 370/395.4 |
| 6,044,211 A * | 3/2000 | Jain | 716/102 |
| 6,064,677 A * | 5/2000 | Kappler et al. | 370/395.43 |
| 6,184,707 B1 | 2/2001 | Norman et al. | |
| 6,198,723 B1 * | 3/2001 | Parruck et al. | 370/230.1 |
| 6,265,894 B1 * | 7/2001 | Reblewski et al. | 326/39 |

(Continued)

FOREIGN PATENT DOCUMENTS

EP 0 651 343 5/1995

(Continued)

OTHER PUBLICATIONS

Charles Clos, "A Study of Non-Blocking Switching Networks", The Bell System Technical Journal, Mar. 1953, pp. 406-424.

(Continued)

*Primary Examiner* — William Trost, IV
*Assistant Examiner* — Andrew Chriss
(74) *Attorney, Agent, or Firm* — Banner & Witcott, Ltd.

(57) ABSTRACT

Message send and receive blocks are provided to emulation ICs and reconfigurable interconnect ICs of an emulation system to reduce the multiplexed transfer latency of critical emulation signals. Each of a corresponding pair of a message send block and a message receive block is provided with a signal state value inclusion schedule to control operation of the message send and receive blocks. The signal state inclusion schedule calls for some signals within a message to be sent more often than other signals within the message. In some embodiments a parity value is implemented as part the message and included in the signal state inclusion schedule.

20 Claims, 8 Drawing Sheets

U.S. PATENT DOCUMENTS

| 8,265,894 | | 7/2001 | Reblewski et al. | |
|---|---|---|---|---|
| 6,473,726 | B1 | 10/2002 | Reblewski | |
| 6,731,638 | B1* | 5/2004 | Ofek | 370/395.4 |
| 2001/0052793 | A1* | 12/2001 | Nakaya | 326/41 |
| 2002/0031086 | A1* | 3/2002 | Welin | 370/229 |
| 2003/0053435 | A1* | 3/2003 | Sindhushayana et al. | 370/342 |
| 2003/0099242 | A1* | 5/2003 | Shah et al. | 370/395.4 |
| 2003/0125907 | A1* | 7/2003 | Saint-Hilaire et al. | 702/186 |
| 2003/0144828 | A1* | 7/2003 | Lin | 703/21 |
| 2004/0030816 | A1* | 2/2004 | Knight et al. | 710/52 |
| 2006/0117274 | A1* | 6/2006 | Tseng et al. | 716/1 |

FOREIGN PATENT DOCUMENTS

| WO | WO 94/06210 | 3/1994 |
|---|---|---|

OTHER PUBLICATIONS

Werner Erhard et al., "First Steps towards a Reconfigurable Asynchronous System", Friedrich-Schiller University Jena, Department of Computer Science, IEEE International Workshop on Rapid System Prototyping, Jun. 1999, pp. 28-31.

Fatih Kocan et al., "Concurrent D-Algorithm on Reconfigurable Hardware", IEEE 1999, pp. 152-155.

Jack Jean et al., "Dynamic Reconfiguration to Support Concurrent Applications", IEEE Transactions of Computers, vol. 48, No. 8, Jun. 1999, pp. 591-802.

Bernard Bosi et al., "Reconfigurable Pipelined 2-D Convolvers for Fast Digital Signal Processing", IEEE Transactions on Very Large Scale Integration (VLSI) Systems, vol. 7, No. 3, Sep. 1999, pp. 299-308.

A. Ejnioui et al., "Design Partitioning on Single-Chip Emulation Systems", Center for Microelectronics Research, Dept of CSE, University of South Florida, 13$^{th}$ International Conference on VLSI Design, 2000, pp. 234-239.

Greg Snider, "The Teramac Compiler", Hewlett-Packard, 1996, pp. 1-51.

Xilinix, "Programmable Gate Array Design Handbook", First Edition, 1986, pp. I-A10.

Jonathan Babb, et al., "Logic Emulation with Virtual Wires", IEEE Transactions on Computer-Aided Design of Integrated Circuits and Systems, Jun. 1997, pp. 1-20.

* cited by examiner

Key:
RLR = Reconfigurable Logic Resources
RIN = Reconfigurable Interconnect Network
MEM = Memory
DBR = Debugging Resources
CR = Configuration Registers
CTX = Context/State Element
MSR = Message Send and Receive

400

| |
|---|
| A |
| B |
| A |
| C |
| A |
| B |
| A |
| D |
| A |
| B |
| A |
| C |
| A |
| B |
| A |
| parity value |

MESSAGE-BASED LOW LATENCY CIRCUIT EMULATION SIGNAL TRANSFER

FIELD OF THE INVENTION

The invention relates to the field of emulation. More specifically, the invention relates to low latency emulation signal transfer between emulation integrated circuits (ICs).

BACKGROUND OF THE INVENTION

First generation emulation systems were formed using general purpose reconfigurable integrated circuits (ICs) without integrating debugging facilities, such as general purpose field programmable gate arrays (FPGAs), and reconfigurable interconnects, such as crossbars. To emulate a circuit design on one of such emulation systems, the circuit design would be "realized" by compiling a formal description of the circuit design (expressed, e.g., in the hardware description language Verilog), partitioning the circuit design into subsets (also referred to as netlists), mapping the various subsets (netlists) to the logic elements (LEs) of the FPGAs of various logic boards of the emulations system, and then configuring the reconfigurable interconnects to interconnect the LEs. The partitioning and mapping operations would be typically performed on workstations that are part of or complementary to the emulation systems. The resultant configuration information, i.e., the information to configure the logic elements and/or interconnects, would be downloaded onto logic boards hosting the reconfigurable logic ICs and reconfigurable interconnect ICs, and then onto the reconfigurable logic ICs and reconfigurable interconnect ICs themselves.

During emulation, test stimuli are either generated on the workstation or on a service board of the emulation system under the control of the workstation, and then transferred to the various logic boards for input into the reconfigurable logic ICs for application to the various netlists of the circuit design being emulated. To emulate the operation of the circuit design, emulation signals often must be transferred from one reconfigurable logic IC to another. At appropriate points in time, state data of various circuit elements as well as various signals of interest of the circuit design being emulated, would be read out of the appropriate reconfigurable logic ICs and then transferred off the logic boards for analysis on the companion workstation.

With advances in integrated circuit and emulation technology, some late model emulation systems would employ FPGAs specifically designed for emulation purposes. These special FPGAs typically would include a substantial number of on-chip reconfigurable logic elements, interconnects, memory, and debugging resources. As the advances continue, more of these resources are packed into each FPGA, enabling more circuit elements to be "realizable" and "emulate-able" on each FPGA. This has resulted in, the pin to logic element ratio, i.e., the number of pins available to transfer signals of the circuit under emulation off one emulation IC to another emulation IC, to steadily decline.

Some emulation systems employ what is referred to as a time domain multiplexing approach, allocating multiple signals to share a physical pin/interconnect over time. For example, assume that three emulation signals (A, B and C) need to be routed from one reconfigurable logic IC to another reconfigurable logic IC. The three emulation signals may be assigned or allocated to share the same physical pin or wire. During an emulation cycle, the physical pin/wire is used to transfer the three signals, in turn, in three sub-cycle periods of the emulation clock in a predetermined order, e.g. A, B, C, or B, C, A. These systems suffer from a number of known disadvantages. For example, straight time multiplexing or time division (of the emulation clock) cannot be used for circuit designs having asynchronous signals.

Thus, an improved approach to transferring emulation signals between reconfigurable logic or interconnect ICs in an emulation system is desired.

SUMMARY OF THE INVENTION

Aspects of the present invention are directed to reducing the latency of messaging to and from emulation chips. Emulation chips typically have a plurality of pins for communicating externally from the chips. The communications may be in the form of messages that may be multiplexed, since the number of inputs and outputs required by an emulation system usually outnumbers the pins available on the emulation chip packages. Some messages may be considered critical (i.e., have a high priority), and these critical messages may be given special handling. For instance, time-sensitive messages may be transmitted during a multiplex cycle more often than non-time-sensitive messages. This reduces the average latencies of the critical messages from when the information in the messages is needed to be sent outside the chip and when the messages containing that information are actually sent.

Further aspects of the present invention are directed to scheduling of message multiplexing. A signal inclusion schedule may be provided that directs message transmission circuitry to transmit multiplexed messages according to the signal inclusion schedule. The signal inclusion schedule may provide for critical messages to be transmitted more frequently than non-critical messages.

Still further aspects of the present invention are directed to determining the criticalness of messages. The signal inclusion schedule may be generated based on such a determination.

Yet further aspects of the present invention are directed to receiving a plurality of signals over a single input and determining the criticalness of each of the plurality of signals to be received over the input. A signal inclusion schedule may be generated based on the criticalness of each of the plurality of signals, wherein signals of greater time-criticalness are received with greater frequency than signals of lesser time-criticalness.

Still further aspects of the present invention are directed to including one or more parity bits in multiplexed messages between emulation chips, to reduce the possibility of receiving and operating on erroneous message information.

These and additional aspects of the invention will be further understood from the following detailed disclosure of illustrative embodiments.

BRIEF DESCRIPTION OF THE DRAWINGS

The present invention will be described by way of illustrative embodiments shown in the accompanying drawings in which like references denote similar elements, and in which:

FIG. 4 illustrates an illustrative signal state value inclusion schedule, in accordance with at least one aspect of the present invention;

DETAILED DESCRIPTION OF ILLUSTRATIVE EMBODIMENTS

Figure 1:
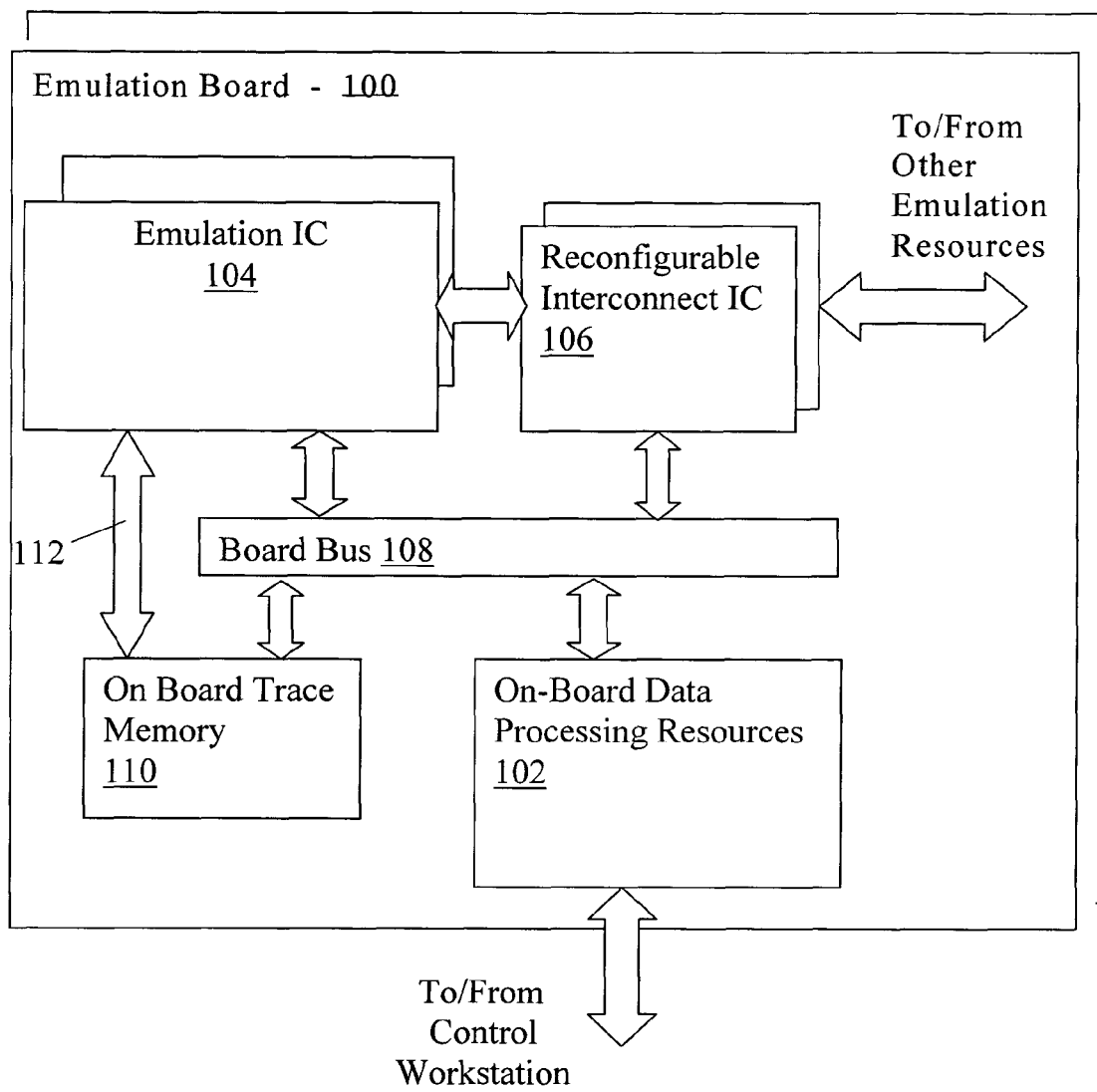
FIG. 1 is an overview of an illustrative emulation logic board in accordance with at least one aspect of the present invention.

As shown in FIG. 1, an illustrative emulation board includes on-board data processing resources 102, on-board emulation ICs 104, on-board reconfigurable interconnect ICs 106, on-board bus 108, and/or on-board trace memory 110 coupled to each other as shown (i.e., through on-board bus 108). Additionally, on-board emulation ICs 104 are also directly coupled to on-board trace memory 110. As used herein, the term "on-board" refers to being physically located on the emulation board.

Emulation ICs 104 may include various resources, such as reconfigurable LEs, reconfigurable interconnects, emulation memory, context or state elements, and so forth, to facilitate emulation of netlists of a circuit design. In particular, each emulation IC 104, as will be described in more detail below, includes a number of signal state value message send and receive blocks to facilitate routing of signals from one emulation IC 104 to one or more other emulation ICs 104 in a logical manner, by signal state value messages.

Reconfigurable interconnect ICs 106 facilitate coupling of the emulation resources of the various emulation ICs 104 of the different emulation logic boards 100 employed to form an emulation system. In particular, each reconfigurable interconnect IC 106, as will be described in more detail below, also includes a number of signal state value message receive and disassembly blocks, and a number of signal state value message formation and send blocks, to facilitate the earlier mentioned routing of signals from one emulation IC 104 to one or more other emulation ICs 104 in a logical manner, by signal state value messages.

On-board bus 108 and trace memory 110 perform their conventional functions of facilitating on-board communication/data transfers, and collection of signal states of the various emulation signals of the assigned partitions or netlists of the circuit design being emulated. On-board bus 108 and on-board trace memory 110 are intended to represent a broad range of these elements known in the art.

In various embodiments, data processing resources 102 of the various emulation logic boards 100 may be employed to locally and correspondingly (i.e., distributively) perform a number of emulation functions on behalf of and at the direction of the control resources.

In some embodiments, an emulation integrated circuit includes at least one reconfigurable logic resource, at least one output pin, and a message formation and send block in communication with the output pin and the reconfigurable logic resource. The message formation and send block is operative to receive multiple output signals from the reconfigurable logic resource and generate a message on the output pin in accordance with a signal inclusion schedule. The at least one reconfigurable logic resource is typically connected to the message formation and receive block by reconfigurable interconnects.

In some embodiments, an emulation integrated circuit comprises at least one reconfigurable logic resource, at least one input pin, and a message receive and disassembly block in communication with the input pin and the reconfigurable logic resources. The message receive and disassembly block is operative to receive a message by the input pin and extract multiple input signals for the reconfigurable logic resource in accordance with a signal inclusion schedule. As with the message formation and send block, the message receive and disassembly block may be connected to the reconfigurable logic resources by reconfigurable interconnects.

Figure 2A:
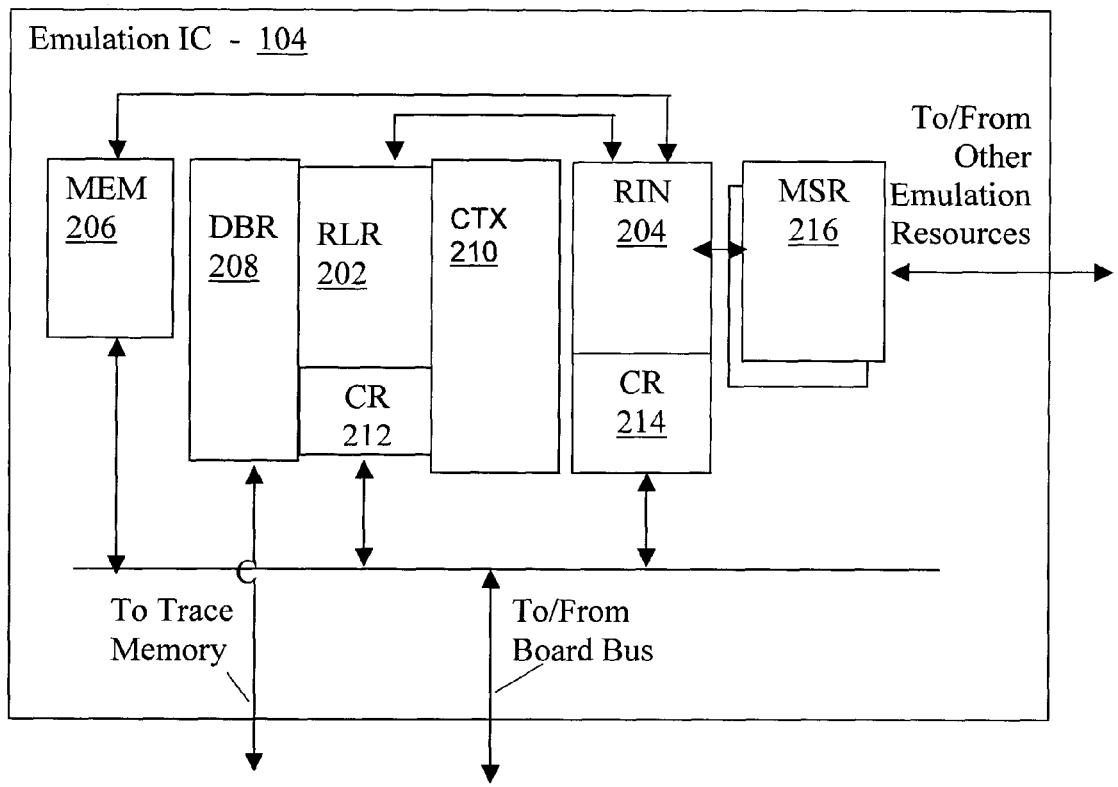
FIG. 2*a* is an illustrative hosted emulation IC of FIG. 1 shown in further detail, in accordance with at least one aspect of the present invention.

Referring now to FIG. 2a, a functional block diagram illustrating an example of emulation IC 104 in further detail is shown. As illustrated in FIG. 2a, emulation IC 104 includes reconfigurable logic elements (LEs) (or reconfigurable logic resources (RLR)) 202, reconfigurable interconnects (RIN) 204, emulation memory (MEM) 206, debugging resources (DBR) 208, context/state elements (CTX) 210, configuration registers (CR) 212 and 214, and a number of message send and receive blocks 216 coupled to each other as shown. Emulation IC 104 may also include a number of reconfigurable I/O resources, i.e. reconfigurable as input and/or output resources (not shown) coupled to message send/receive blocks 216. Examples of such resources are reconfigurable I/O pins.

Reconfigurable LEs 202 and emulation memory 206 are used to emulate circuit elements of the netlists of an assigned partition of a user design. In particular, reconfigurable LEs 202 are used to emulate the combinatorial logic of the netlists of the assigned partition of the design. Context/state elements 210 are used to emulate state elements of the netlists of the assigned partition of the design, such as flip-flops, and so forth, whereas emulation memory 206 is used to emulate storage elements of the netlists of the assigned partition of the design. Reconfigurable interconnects 204 are used to reconfigurably couple LEs 202, memory 206, and so forth.

Message send and receive blocks 216 may be employed to facilitate transfer of signals between emulation ICs 104 through signal state value messages. Each message send and receive block 216 may include a message formation and send block and a message receive and disassembly block, also referred to herein as send blocks and receive blocks, respectively.

A message formation and send block may include a storage unit having a signal inclusion schedule for a plurality of signals to be included in at least one message to be generated and transmitted. The message formation and send block may further include circuitry coupled to the storage unit and operative to generate and transmit a message, wherein the message is formed from the plurality of signals in accordance with the inclusion schedule.

In some embodiments, the message formation and send block is coupled to n output lines of reconfigurable interconnect 204 on its input side, and a single output pin of emulation IC 104 on its output side. Each message formation and send block is responsible for transferring up to n signals to one or more other emulation ICs 104 (by one or more reconfigurable interconnect ICs 106) logically, by signal state value messages. In accordance with certain embodiments, each signal state value message may have n bits in which each bit represents a state value of one of the n signals. Each of the n bits may represent the state value of a different one of the n signals (i.e., a one-to-one correlation between the n bits and the n signals), or some of the n bits may represent the state values of some of the same n signals, such that the state value of one or more of the signals is included more than once in the message. For example, in an embodiment where n equals 16, each message formed and sent by a message send block may include eight state values of a signal A, four state values of a signal B, two state values of a signal C, and two state values of a signal D. The frequency of inclusion of state values of a particular signal may depend on the time criticality of that signal. That is, a more time critical signal may be included in signal state value messages more frequently than a signal of lesser criticality.

In some embodiments, the message formation and send block is coupled to n−1 output lines of reconfigurable interconnect 204 on its input side, and a single output pin of emulation IC 104 on its output side. Each message formation and send block is responsible for transferring up to n−1 signals to one or more other emulation ICs 104 (by one or more reconfigurable interconnect ICs 106) logically, via signal state value messages. Each signal state value message may include n−1 state value bits and a parity bit, with at least one of the signals having its state value included more than once in the message. For example, where n equals 16, each message formed and sent by a message send block may include eight state values of signal A, four state values of signal B, two state values of signal C, one state value of signal D, and a parity value of the fifteen included state values (see FIG. 4). In various embodiments, each message formation and send block is also responsible for generating the parity value to be included for the n−1 state values.

The message receive and disassembly block may include a storage unit having a signal inclusion schedule for a plurality of signals to be received in at least one message, and circuitry coupled to the storage unit operative to receive and extract a plurality of signals from a message.

In some embodiments, the message receive and disassembly block is coupled to an input pin of emulation IC 104 on its input side, and n input lines of reconfigurable interconnect 204 on its output side. In these embodiments, each message receive portion is responsible for accepting transfer of up to n signals from one or more other emulation ICs 104 (by one or more reconfigurable interconnect ICs 106) logically, by signal state value messages. For each signal state value message received, the message receive and disassembly block disassembles the message, recovers the signal state values, and conditionally outputs up to n signals accordingly. Signals with multiple state values may be outputted with the same or different states over time, in accordance with the corresponding multiple state values.

In further embodiments, the message receive and disassembly block is coupled to an input pin of emulation IC 104 on its input side, and n−1 input lines of reconfigurable interconnect 204 on its output side. In these embodiments, each message receive and disassembly block is responsible for accepting transfer of up to n−1 signals from one or more other emulation ICs 104 (by one or more reconfigurable interconnect ICs 106) logically, by signal state value messages. For each signal state value message received, the message receive and disassembly block disassembles the message, recovers the state values and the parity value, independently generates a parity verification value to verify the integrity of the received state values, and conditionally outputs up to n−1 signals if the parity value is verified successfully. Signals with multiple state values may be outputted with the same or different states over time, in accordance with the corresponding multiple state values.

In some embodiments, an interconnect integrated circuit includes at least one routing matrix, at least one output pin, and a message formation and send block in communication with the output pin and the routing matrix. The message formation and send block is operative to receive multiple output signals from the reconfigurable logic resource and generate a message on the output pin in accordance with a signal inclusion schedule.

In some embodiments, an interconnect integrated circuit comprises at least one routing matrix, at least one input pin; and a message receive and disassembly block in communication with the routing matrix and the input pin. The message receive and disassembly block is operative to receive a message via the input pin and extract multiple input signals for the routing matrix in accordance with a signal inclusion schedule.

Figure 2B:
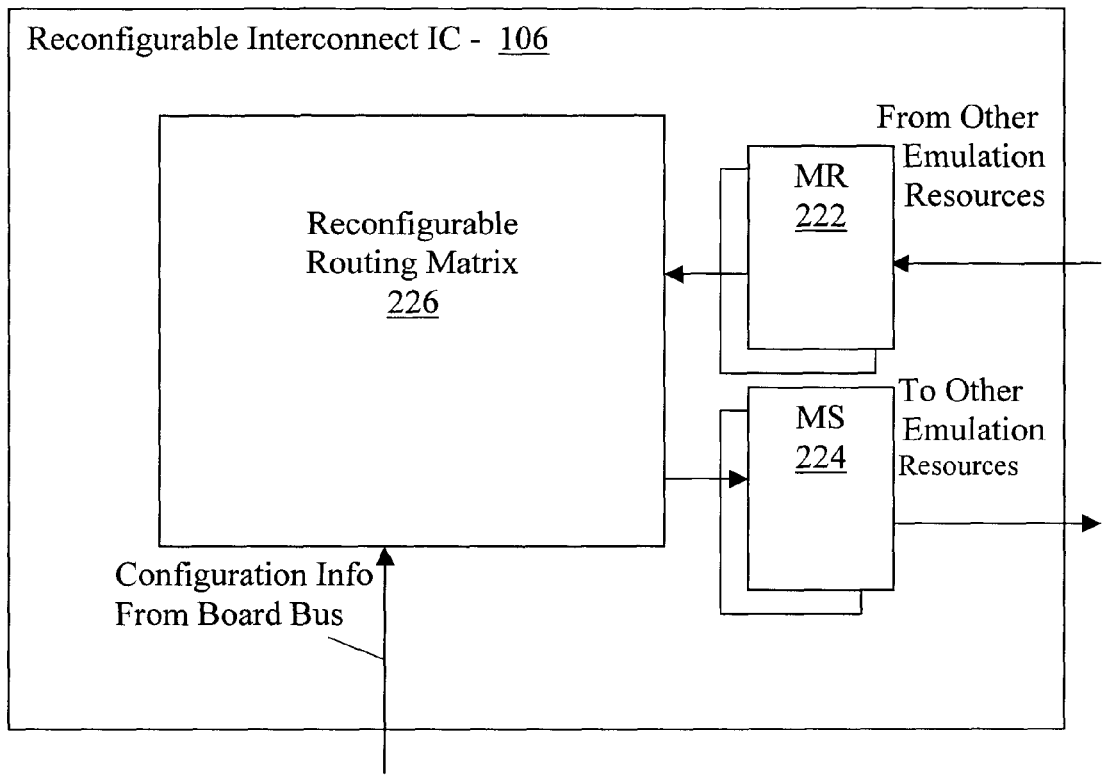
FIG. 2*b* illustrates an illustrative hosted reconfigurable interconnect IC of FIG. 1 shown in further detail, in accordance with at least one aspect of the present invention.

FIG. 2b illustrates an example reconfigurable interconnect IC 106 in further detail, in accordance with one embodiment. As illustrated, reconfigurable interconnect IC 106 includes reconfigurable routing matrix 226, a plurality of message receive blocks 222 and a plurality of message send blocks 224, coupled to each other as shown. As in the case of emulation IC 102, message receive block 222 is coupled to one input pin of reconfigurable interconnect IC 106 on its input side, and n input pins of reconfigurable routing matrix 226. Message receive block 222 may receive signal state value messages from a coupled emulation IC 104 and disassemble each message to recover the included state values of the signals and the parity value.

Reconfigurable routing matrix 226 performs its conventional function of routing m input signals (n signals each, from m/n message receive blocks 222) onto m output paths, in accordance with the way the routing paths of reconfigurable routing matrix 226 are configured.

Each message send block 224 is coupled to n output pins of reconfigurable routing matrix 226 on its input side, and one output pin of reconfigurable interconnect IC 106 on its output side. Each message send block 224 receives up to n output signals from reconfigurable routing matrix 226 and forms messages including state values of up to n output signals. Each message send block 224 transfers the signals to one or more other emulation ICs 104 directly or through one or more reconfigurable interconnect ICs 106.

Referring back to FIG. 1, up to n signals may be logically transferred out of the emulation IC 104 through one output pin of the emulation IC 104 by signal state value messages. The signal state value messages for the up to n signals received through an input pin on a coupled reconfigurable interconnect IC 106 may be disassembled and re-packaged into one or more other streams of messages for up to n signals. The streams of messages may be forwarded to one or more emulation ICs 104 directly or through one or more reconfigurable interconnect ICs 106, with the state values of the signals being disassembled and re-assembled.

Figure 3:
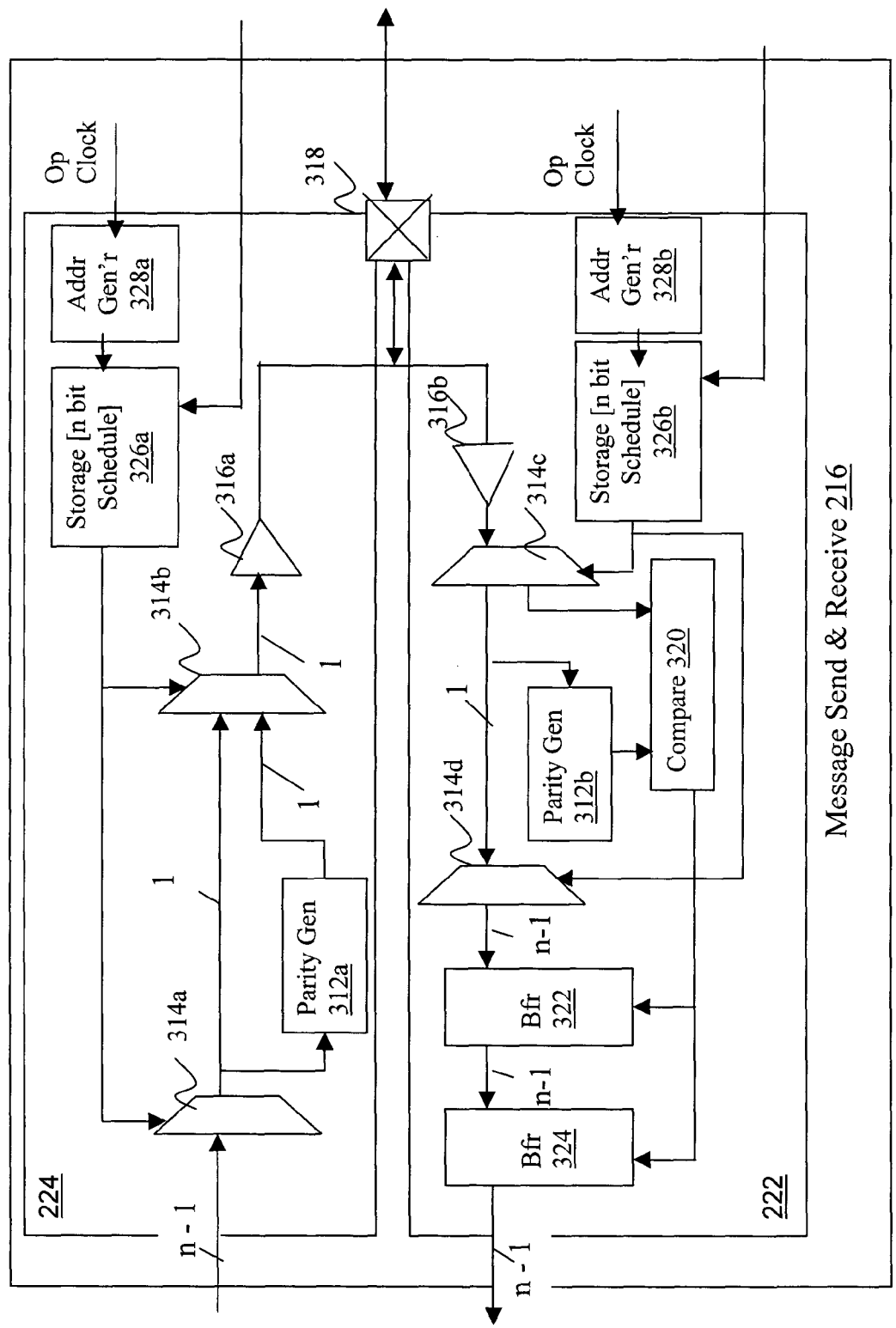
FIG. 3 illustrates an illustrative message send and/or receive block of FIGS. 2a and 2b, in accordance with at least one aspect of the present invention.

Referring now to FIG. 3, wherein an example block diagram of a message send and receive block 216 is shown. As illustrated, the circuitry of the message send block 224 includes n−1 to 1 multiplexor 314a, 2 to 1 multiplexor 314b, logic gate 316a, parity generator 312a, storage unit 326a, and address generator 328a. The message send block 224 may receive n−1 output lines from reconfigurable interconnect 204 (shown in FIG. 2a) or reconfigurable routing matrix 226 (shown in FIG. 2b), and may be coupled to an output pin 318.

The n−1 to 1 multiplexor 314a is coupled to the n−1 output lines (of reconfigurable interconnect 204 or reconfigurable routing matrix 226) and provides the n−1 state values to the parity generator 312a and to the 2 to 1 multiplexor 314b.

Parity generator 312a, in response to the received n−1 state values, generates a corresponding parity value for each set of the included n−1 state values of a message.

The 2 to 1 multiplexor 314b multiplexes the included n−1 state values and the corresponding parity value to form a signal state value message.

Figure 4:
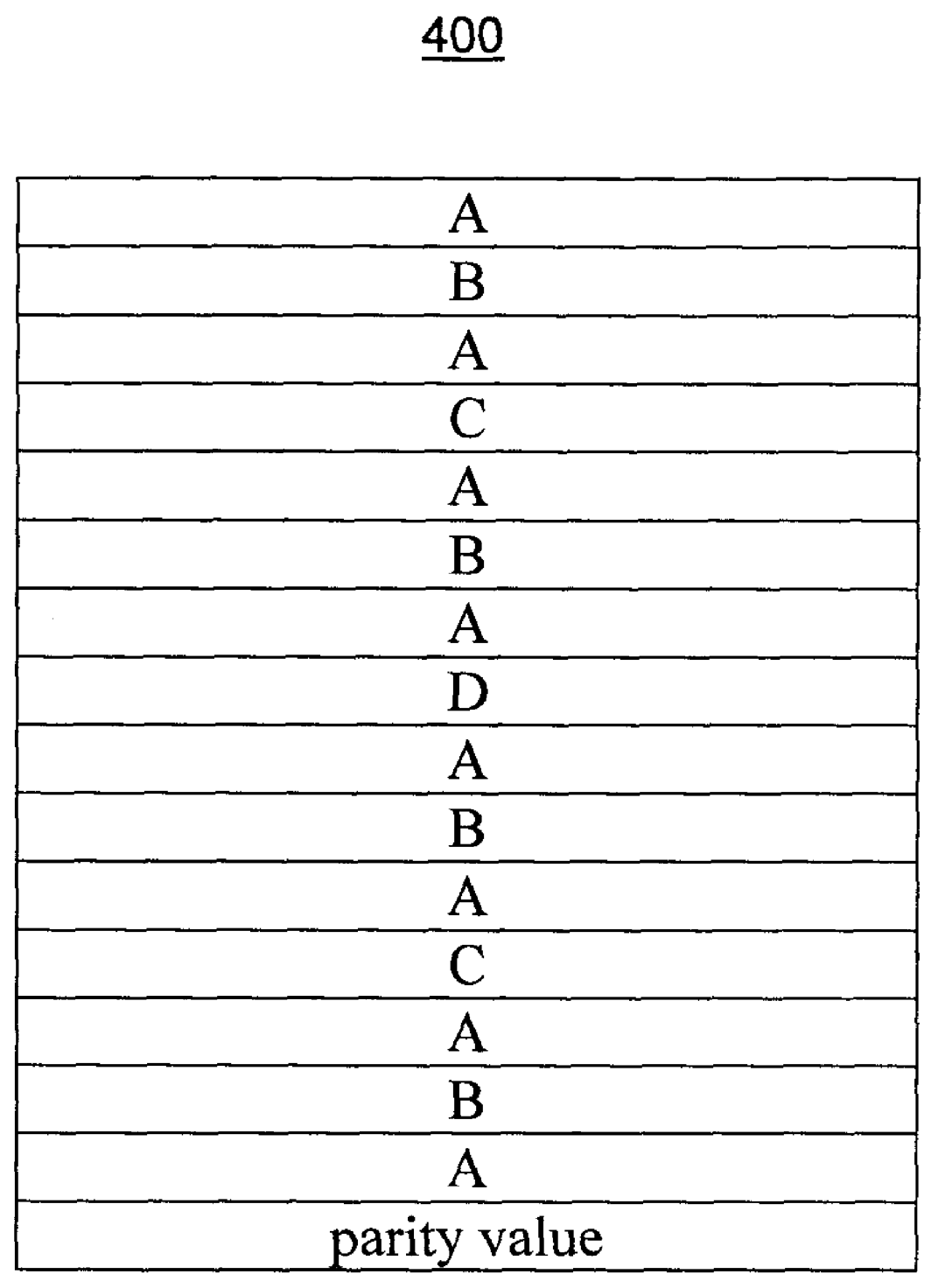

The n−1 to 1 multiplexor 314a, and the 2 to 1 multiplexor 314b are controlled by control signals provided by storage unit 326a, which may be a random access memory (RAM) or other memory having at least n storage locations programmed with a signal state value inclusion schedule for an emulation cycle (see FIG. 4, where one example is illustrated). For the illustrated embodiment, storage unit 326a outputs control signals responsive to addresses (addressing the n storage locations in storage unit 326a) provided by address generator 328a. Address generator 328a may include a $\log_2 n$ bit counter that generates the n addresses for storage unit 326a. Address generator 328a may operate responsive to an operating clock that is independent of an emulation clock.

In the illustrated embodiment of FIG. 3, n−1 to 1 multiplexor 314a selects a corresponding signal state value responsive to the provided control signal and passes it to the 2 to 1 multiplexor 314b. The 2 to 1 multiplexor 314b selects the n−1 state values for all control values, except for the control value designating the selection of the included parity value. In that case, 2 to 1 multiplexor 314b selects the parity value accordingly.

Each message send block 224 may thus be programmed with a signal inclusion schedule for up to n−1 signals and a parity value. Message send block 224 may form signal state value messages continuously for up to n−1 signals and a parity value, with one message per n cycles of an operation clock (which may be faster than the emulation clock).

The circuitry of the illustrated message receive block 222 includes logic gate 316b, 1 to 2 de-multiplexor 314c, 1 to n−1 de-multiplexor 314d, parity generator 312b, comparator 320, buffers 322-324, storage unit 326b, and address generator 328b.

One-to-two de-multiplexor 314c de-multiplexes a message received from the input pin 318 and provides the n−1 state values to the 1 to n−1 de-multiplexor 314d and to parity verification value generation circuitry (shown here as parity generator 312b). One-to-two multiplexor 314c also provides the corresponding parity value of the message to comparator 320.

Parity generator 312b independently re-generates the corresponding parity value for the provided n−1 state values, and provides the independently re-generated parity value to comparator 320.

Comparator 320 compares two parity values: one extracted from the message by 1 to 2 de-multiplexor 314c and the other independently re-generated by parity generator 312b. Comparator 320 outputs control values to control the operation of buffer 322-324 based on the result of the comparison of the two parity values.

The 1 to n−1 de-multiplexor 314d de-multiplexes the included n−1 state values for buffer 322, which stores the n−1 state values unconditionally. However, buffer 322 may output each set of stored n−1 state values to buffer 324 in response to the control signal provided by comparator 320, which is provided responsive to the two earlier described parity values comparing successfully.

Buffer 324 may store the n−1 state values outputted by buffer 322. Buffer 324 will store the outputs of buffer 322 upon being directed by comparator 320, which so directs if the two earlier described parity values compare successfully. Buffer 324 outputs n−1 signals with state values corresponding the n−1 state values stored. The n−1 signals may then go to reconfigurable interconnect 204 (shown in FIG. 2a) or reconfigurable routing matrix 226 (shown in FIG. 2b).

For this embodiment, messages that fail the parity value verification are effectively discarded (as they are not outputted and are overwritten by the next message).

Operation of de-multiplexors 314c-314d are controlled by control signals provided by storage unit 326b, which for this embodiment, is a memory such as a random access memory (RAM) having at least n storage locations storing a signal state value inclusion schedule for an emulation cycle (see FIG. 4, where one example is illustrated). For the illustrated embodiment shown in FIG. 3, storage unit 326b outputs the control signals as programmed, responsive to addresses provided by address generator 328b. In one embodiment, address generator 328b is a counter having $\log_2 n$ bits to output the n addresses for storage unit 326b. In one embodiment, address generator 328b operates responsive to clock cycles of an operating clock that is independent of an emulation clock.

For this embodiment, 1 to 2 de-multiplexor 314c selects the included n−1 state values for all control values, except for the control value designating the selection of the included parity value. In that case, 1 to 2 de-multiplexor 314c selects the included parity value accordingly. The 1 to n−1 de-multiplexor 314d selects one of the included n−1 state values in accordance with the provided control value.

Accordingly, each message receive portion/unit 222 may be programmed with a signal inclusion schedule for up to n−1 signals, to allow portion/unit 222 to receive and disassemble signal state value messages continuously for up to n−1 signals, one message per n cycles of an operation clock (which is typically faster than the emulation clock of the design).

In this embodiment, where message send 224 and message receive 222 blocks are configured to share a common pin 318, logic gates 316a and 316b are used to ensure the proper flow of messages to and from the common pin 318.

For ease of understanding, each message send portion and each message receive portion is provided with its own address generator 328a or 328b, and in some embodiment the various send/receive portions may share a single address generator 328a/328b. Similarly, for ease of understanding, different storage units 326a and 326b (for storing messaging send and receive schedules) are shown, and in certain embodiments message send and receive portions may share a common storage unit in storing their respective schedules, provided the addresses are appropriately adjusted.

The operations of sending and receiving a plurality of signals have been set forth above. The process of generating a message from the multiple signals as well as extracting the signals back out from the message is dependent on the signal inclusion schedule. The order of signals as well as their frequency of occurrence in the message is stipulated or controlled by the signal inclusion schedule. An example of a signal inclusion schedule can be seen in FIG. 4, the order of the signals being shown from top to bottom in the figure. Here within sixteen bits, signal A occurs eight times, signal B occurs four times, signal C occurs two times, and signal D and the parity value each appear once. To arrive at this signal inclusion schedule a determination was made that signal A was the most critical signal, hence it occurs the most, that signal B was the second most critical with four occurrences, that signal C was less critical at two occurrences, and that signal D was the least critical. The parity bit is used to ensure the proper message was transferred.

Figure 5:
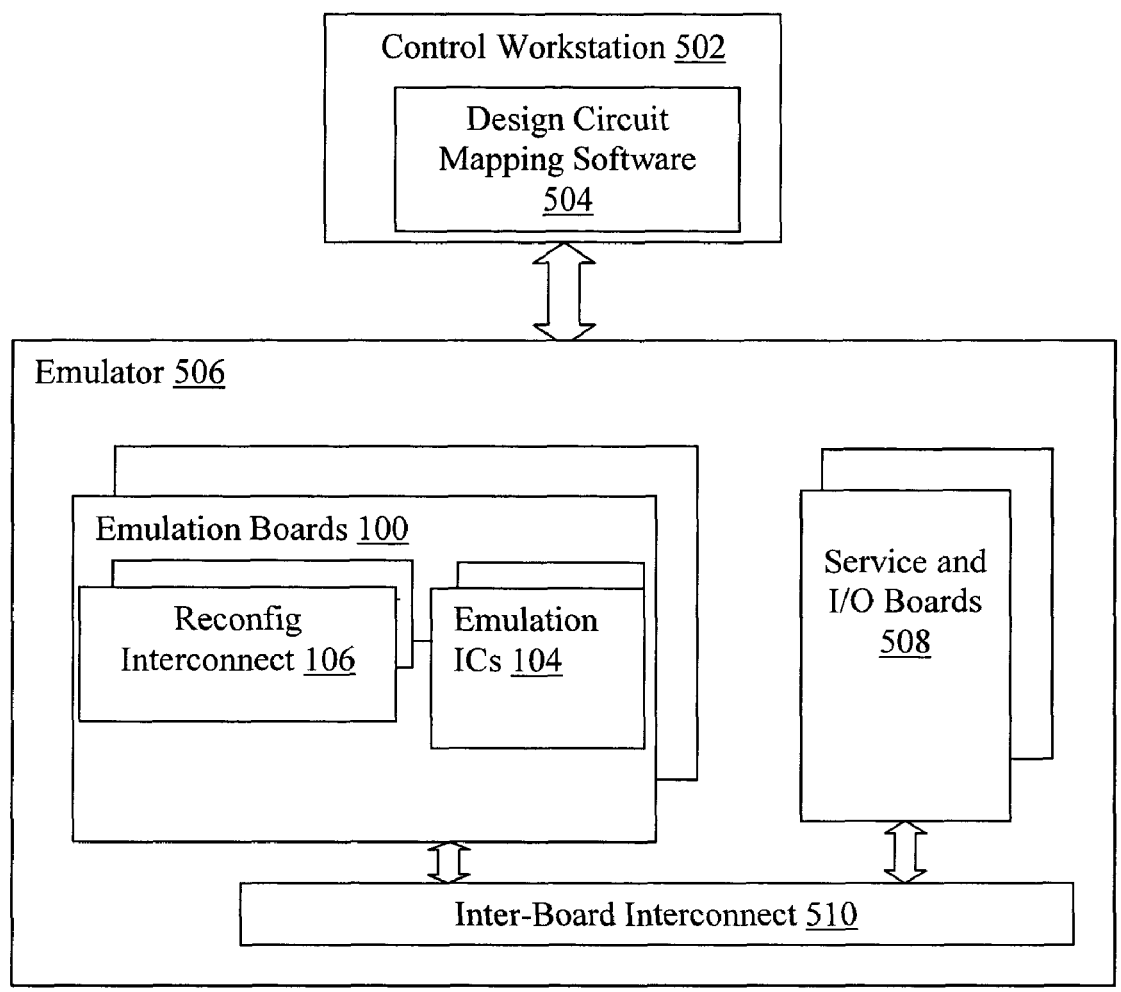
FIG. 5 illustrates an illustrative emulation system in accordance with at least one aspect of the present invention.

Referring now to FIG. 5, a functional block diagram of an illustrative emulation system is shown. As illustrated, emulation system 500 includes control workstation 502 and emulator 506. Control workstation 502 is equipped with EDA software 504. Emulator 506 includes a number of emulation logic boards 100, each having a number of emulation ICs 104 and reconfigurable interconnect ICs 106 disposed thereon as described earlier. In addition to emulation logic boards 100, emulator 506 also includes service and I/O boards 508.

Boards 100 and 508 are interconnected by inter-board interconnects 510. In one embodiment, various boards 100 and 508 are packaged together to form a crate, and the crates may also be interconnected together via one or more inter-board interconnects 510. The precise numbers of emulation ICs 104 and reconfigurable interconnect ICs 106 disposed on each board, as well as the precise manner in which the various boards are packaged into crates are unimportant and application dependent.

EDA software 504 may be configured to take advantage of the earlier described messaging facilities. EDA software 504 is intended to represent a broad range of the software typically supplied with an emulation system, including in particular the software for partitioning the netlists of a design at the system level, and the software for debugging and testing the design being emulated, such as model simulators.

Figure 6:
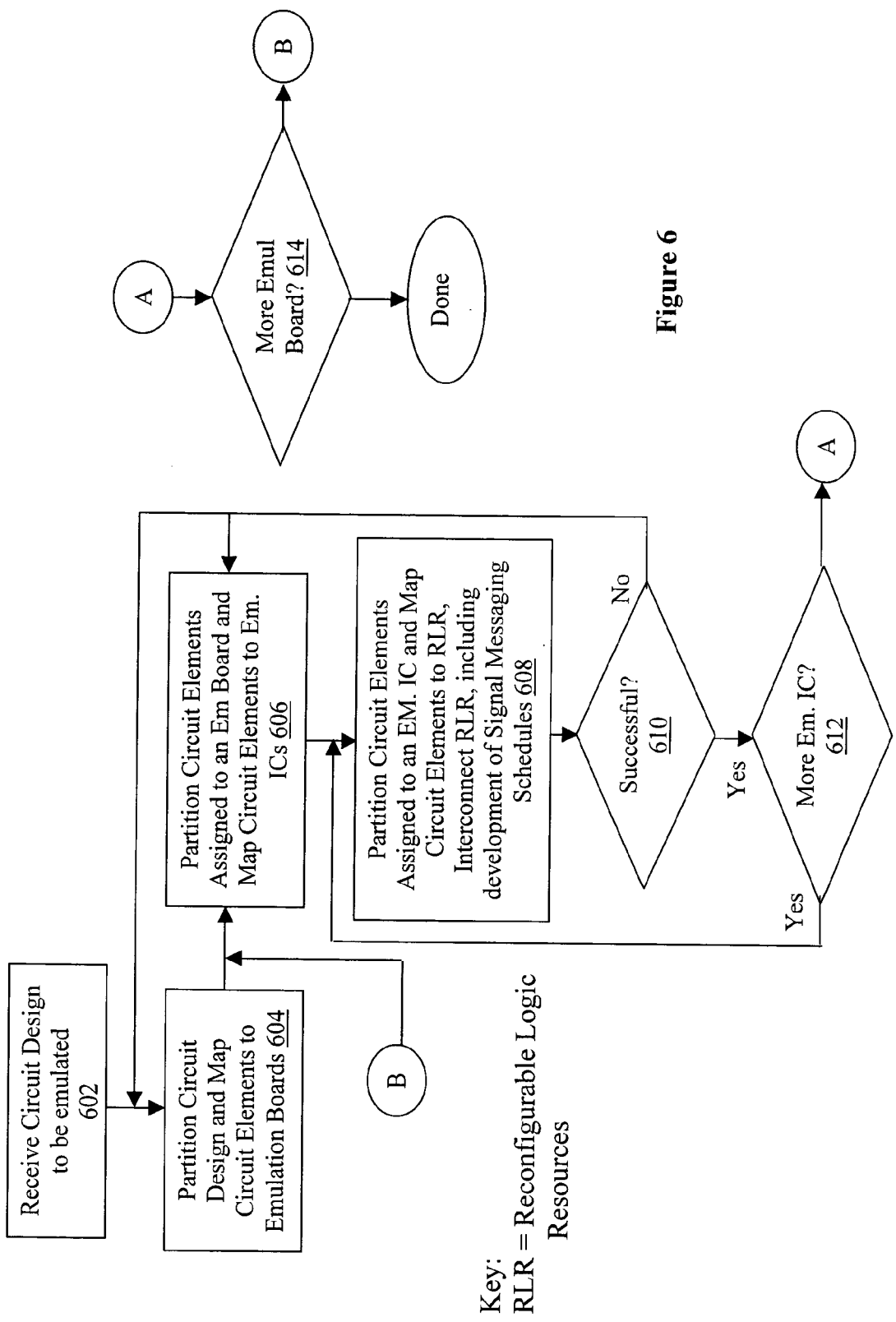
FIGS. 6 & 7 illustrate an illustrative operational flow of aspects of mapping software of FIG. 5, in accordance with at least one aspect of the present invention.

Referring now to FIG. 6, a flow chart shows an illustrative operational flow of mapping software 504. As discussed above, upon receipt of a circuit design to be emulated (block 602), mapping software 504 partitions the circuit design and maps circuit elements of the circuit design to various emulation boards 100 (block 604).

Next, at block 606, for each emulation board 100, mapping software 504 may further analyze the design elements and partition them into groups, assigning them to be emulated by the various emulation ICs 104. At block 608, for each emulation ICs 104, mapping software 504 may analyze the circuit elements and further partition them into sub-groups or individual elements, assigning the sub-groups or elements to various ones of the reconfigurable logic resources (LEs) of the emulation ICs 104. The mapping software 504 may further determine how the assigned LEs are to be interconnected. The mapping software 504 may further develop a signal inclusion schedule for each message send/receive block 224/222 to form and send messages and/or to receive and disassemble messages for groups of signals, as described above.

If the partitioning and assignment of design elements to reconfigurable resources of an emulation IC 104 is successful (block 610), then the mapping software 504 repeats the process for further emulation ICs 104 of the same or further emulation boards 100 (blocks 612 and 614). If, in the course of the mapping process, the mapping software 504 is unable to develop messaging schedules for one or more message send and/or receive blocks 224 and/or 222, or for other reasons is unable to complete the partitioning and assignment of design elements, then the mapping software 504 may loop back and re-perform the immediately higher level of partitioning by re-partitioning the design elements to use resources spread over more reconfigurable logic resources and/or emulation ICs 104.

The process continues in the above-described iterative manner, until either the mapping software 504 is successful or concludes that it will be unable to map the design. The latter may occur where the mapping software 504 has exhausted all options in spreading the usage of emulation resources.

Figure 7:
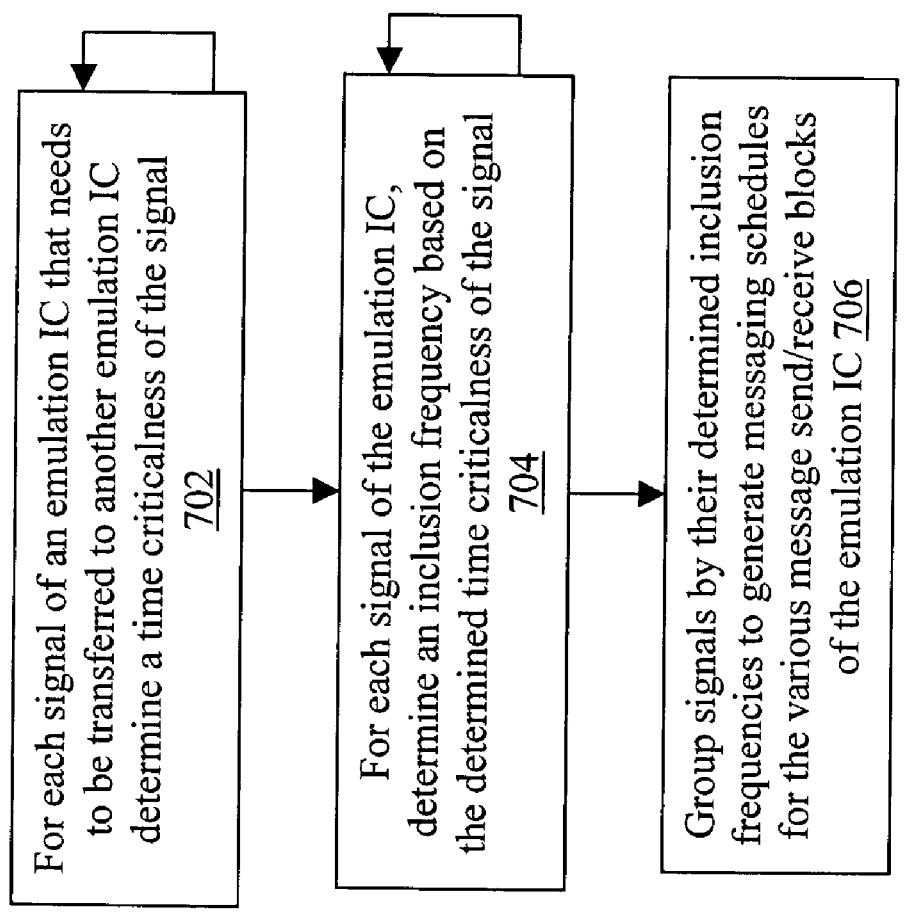

FIG. 7 illustrates an example process for developing messaging schedules for the message send and receive blocks of a particular emulation IC 104. Note that the messaging schedule for a message send block associated with an output pin of the emulation IC 104 can apply equally to the counterpart message receive block of a reconfigurable interconnect IC 106.

At block 702, one or more metrics are determined that reflect the time-criticalness of each of the various signals of the emulation IC 104 that need to be transferred out of the particular emulation IC 104 to other emulation ICs 104. Any of a number of metrics may be employed, such as the number of critical path containing the signal, or the number of logical levels between the signal and the next flip-flop.

At block 704, inclusion frequencies for some or all of the various signals are determined based at least on the determined timing criticalness of the various signals. The inclusion frequencies may further be determined based at least in part on the operating clock speed of the emulation ICs 104. In general, the faster the operating clock speed of the emulation ICs 104, the more signal state value messages may be sent per emulation clock cycle. Thus, with an increased number of messages per emulation clock cycle, a less frequent inclusion rate may be employed for each signal state value message.

At block 706, the signals are grouped (subject to the maximum n−1 signal state values of each send block 224 if parity is used), and the signal groups are assigned to the various message send blocks 224 of the particular emulation IC 104.

As discussed above, state values of signals included in various messages received by a reconfigurable interconnect IC 106, upon disassembly, may be re-grouped into different signal groupings, depending on their ultimate destinations. The messaging schedules for the various message send blocks associated with the various output pins of a reconfigurable interconnect IC 106 may also be developed in like manner as described in connection with FIG. 7.

Similarly, if mapping software 504 is unable to successfully generate messaging schedules for an emulation IC 104, mapping software 504 reverts successively to a higher level of the mapping process, to re-perform the partitioning and resource assignment process and further spread the usage of the reconfigurable resources.

As described above, the process may be repeated iteratively, until the mapping software 504 is able to converge on partitioning solution or concludes that it is unable to do so.

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A reconfigurable emulation integrated circuit, comprising:
   a storage unit comprising a signal inclusion schedule; and
   circuitry, coupled to the storage unit, operative to generate and transmit a message outside the reconfigurable emulation integrated circuit, the message assembled in accordance with the signal inclusion schedule and comprising a plurality of emulation signals, wherein the signal inclusion schedule selects the plurality of emulation signals from at least one pin when the message is assembled and specifies the order and frequency of occurrence of each of the plurality of emulation signals in the message.

2. The reconfigurable emulation integrated circuit of claim 1, wherein the frequency of occurrence specified by the signal inclusion schedule is based on a determination that particular emulation signals in the message are more critical than other emulation signals in the message, and the particular emulation signals that are more critical occur in the message with greater frequency than the other emulation signals in the message.

3. The reconfigurable emulation integrated circuit of claim 2, wherein the order specified by the signal inclusion schedule is determined based on the determined frequency of occurrence.

4. The reconfigurable emulation integrated circuit of claim 1, wherein the message is generated and transmitted in a plurality of clock cycles of an operating clock that is independent of an emulation clock of the plurality of signals.

5. The reconfigurable emulation integrated circuit of claim 1, wherein the circuitry further includes a parity value generator and wherein the message further comprises a parity value generated by the parity value generator.

6. The reconfigurable emulation integrated circuit of claim 1, wherein the message is generated and transmitted for a number of clock cycles of an operating clock, and the signal inclusion schedule is determined to provide a number of signal selections equal to the number of clock cycles.

7. The reconfigurable emulation integrated circuit of claim 1, wherein the message is generated and transmitted for a number of clock cycles of an operating clock, and the signal inclusion schedule is determined to provide a number of signal selections less than the number of clock cycles.

8. A reconfigurable integrated circuit, comprising:
a storage unit comprising a signal inclusion schedule for a plurality of emulation signals to be received in a message, the plurality of emulation signals selected from at least one pin when the message is assembled; and
circuitry, coupled to the storage unit, operative to receive the message and extract the plurality of emulation signals from the message in accordance with the signal inclusion schedule, wherein the signal inclusion schedule specifies the order and frequency of occurrence of each of the plurality of emulation signals in the message.

9. The reconfigurable emulation integrated circuit of claim 8, wherein the frequency of occurrence specified by the signal inclusion schedule is based on a determination that particular emulation signals in the message are more critical than other emulation signals in the message, and the particular emulation signals that are more critical occur in the message with greater frequency than the other emulation signals in the message.

10. The reconfigurable emulation integrated circuit of claim 8, wherein the message comprises state values of the plurality of emulation signals.

11. The reconfigurable emulation integrated circuit of claim 8, wherein the message is received and disassembled in a plurality of clock cycles of an operating clock that is independent of an emulation clock of the plurality of emulation signals.

12. The reconfigurable emulation integrated circuit of claim 8, wherein a parity value is extracted from the message.

13. The reconfigurable emulation integrated circuit of claim 12, wherein the circuitry is further configured to generate a parity verification value from the extracted plurality of emulation signals and compare the parity verification value with the extracted parity value.

14. An emulation integrated circuit, comprising:
at least one reconfigurable logic resource;
at least one output pin; and
a message formation and send block in communication with the output pin and the reconfigurable logic resource, the message formation and send block operative to receive emulation signals from the reconfigurable logic resource and generate a message on the output pin in accordance with a first signal inclusion schedule that selects at least one of the emulation signals when the message is generated, wherein the first signal inclusion schedule specifies the order and frequency of occurrence of each of the emulation signals in the message.

15. The emulation integrated circuit of claim 14, further comprising:
an input pin; and
a message receive and disassembly block in communication with the input pin and the reconfigurable logic resource, operative to receive a message and extract second emulation signals from the message in accordance with a second signal inclusion schedule.

16. The emulation integrated circuit of claim 14, further comprising a second output pin and a second message formation and send block in communication with the second output pin and the reconfigurable logic resource, the second message formation and send block operative to receive emulation signals from the reconfigurable logic resource and generate a second message on the output pin in accordance with a different signal inclusion schedule.

17. The emulation integrated circuit of claim 14, further comprising a plurality of reconfigurable logic resources in communication with the message formation and send block.

18. An emulation integrated circuit, comprising:
at least one reconfigurable logic resource;
at least one input pin; and
a message receive and disassembly block in communication with the reconfigurable logic resource and the input pin, the message receive and disassembly block operative to receive a message assembled from a selection of emulation signals from at least one pin when the message is assembled in accordance with a first signal inclusion schedule, wherein the message is received at the at least one input pin and the emulation signals are extracted for the at least one reconfigurable logic resource in accordance with a second signal inclusion schedule, wherein the second signal inclusion schedule specifies the order and frequency of occurrence of each of the emulation signals in the message.

19. The emulation integrated circuit of claim 18, wherein the first signal inclusion schedule and the second signal inclusion schedule are different signal inclusion schedules.

20. The emulation circuit of claim 18, wherein the first signal inclusion schedule comprises a message send schedule and the second signal inclusion schedule comprises a message receive schedule.

* * * * *